United States Patent [19]

Brews et al.

[11] 4,135,289

[45] Jan. 23, 1979

[54] METHOD FOR PRODUCING A BURIED JUNCTION MEMORY DEVICE

[75] Inventors: John R. Brews, New Providence; Dawon Kahng, Bridgewater Township, Somerset County, both of N.J.

[73] Assignee: Bell Telephone Laboratories, Incorporated, Murray Hill, N.J.

[21] Appl. No.: 827,105

[22] Filed: Aug. 23, 1977

[51] Int. Cl.$^2$ .............................................. H01L 21/26
[52] U.S. Cl. .................................... 29/571; 148/1.5; 148/187; 357/24
[58] Field of Search ................... 148/187, 1.5; 357/23, 357/24; 29/577 R, 577 C, 571

[56] References Cited

U.S. PATENT DOCUMENTS

| Re. 28,653 | 12/1975 | Murphy | 148/187 X |
|---|---|---|---|
| 3,615,956 | 10/1971 | Irving et al. | 148/1.5 X |
| 3,676,715 | 7/1972 | Brojdo | 307/304 |
| 3,752,711 | 8/1973 | Kooi et al. | 148/33.3 |
| 3,783,047 | 1/1974 | Paffen et al. | 148/1.5 X |
| 3,873,371 | 3/1975 | Wolf | 148/1.5 |
| 3,873,372 | 3/1975 | Johnson | 148/1.5 |
| 3,936,857 | 3/1976 | Ota | 357/23 |
| 3,982,264 | 9/1976 | Ishitani | 357/22 |

OTHER PUBLICATIONS

Applied Physics Letters, vol. 27, No. 3, Aug. 1975, pp. 147 and 148.
Applied Physics Letters, vol. 29, No. 3, Aug. 1976, pp. 198–200.

*Primary Examiner*—G. Ozaki
*Attorney, Agent, or Firm*—D. Caplan

[57] ABSTRACT

A method for making a metal oxide semiconductor field effect transistor (MOSFET) is disclosed that results in a semiconductor device structure in which the source and drain regions are buried in the structure beneath a typically thick oxide and bulge out in the semiconductor underneath, but not contiguous with, the interface of a typically thin gate oxide with the semiconductor. This bulging of the buried drain, in an N-channel device, results in an electric field profile during operation which curves away from the interface in the neighborhood of the drain, thereby reducing deleterious transport of electrons from the channel to the gate oxide. The method can also be adapted for fabricating integrated memory cell arrays. This adaptation involves the implantation of one or more layers of dopant ions in the region of the semiconductor between the oxide interface and the bulging portion of the buried drain. The purpose of these layers is to control access of charge carriers to the surface and to control the charge storage properties of the surface region.

3 Claims, 7 Drawing Figures

METHOD FOR PRODUCING A BURIED JUNCTION MEMORY DEVICE

FIELD OF THE INVENTION

This invention relates to the field of semiconductor apparatus, and more particularly to semiconductor devices and to processes for fabricating semiconductor devices, and integrated arrays of such devices.

BACKGROUND OF THE INVENTION

In short channel MOSFET devices, that is, below 5 micron channel lengths, a threshold voltage instability is caused by the trapping of electrons in the gate oxide during normal device operation. This phenomenon has been discussed in the literature; for example: S. A. Abbas and R. C. Dockerty, "Hot-Carrier Instability in IGFET's," *Applied Physics Letters,* Vol. 27, pp. 147–148 (1975); T. H. Ning et al., "Threshold Instability in IGFET's Due to Emission of Leakage Electrons from Silicon Substrate into Silicon Dioxide," *Applied Physics Letters,* Vol. 29, pp. 198–200 (1976). Briefly, the threshold instability is caused by the fact that trapping of the charges in the "gate" oxide produces a charge in the oxide, which modifies the threshold voltage required for turning the device "on" or "off" during operation. Therefore, in order to stabilize the threshold, it would be desirable to have a MOSFET device, and a method for making such a MOSFET device, of such a structure that mitigates threshold voltage instabilities.

SUMMARY OF THE INVENTION

In order to obtain an electric field profile in an N-channel MOSFET device, such that trapping of electrons in the oxide is mitigated, a fabrication method for forming the device is used such that, in the resulting device structure, the drain region bulges out from underneath a typically thick oxide and extends in the bulk of the semiconductor to locations underneath, but removed from, the typically thin gate oxide. Thereby, during operation with such a device structure, electric field lines curve away from the gate oxide-semiconductor interface; so that electron trapping in the gate oxide is reduced, if not eliminated.

In a specific embodiment of the invention, upon a major flat (planar) surface of a monocrystalline P-type semiconductive silicon body is grown a relatively thin (200 angstroms, typically) insulating layer of silicon dioxide. Then an insulating silicon nitride layer is deposited on the thin silicon dioxide layer. On top of this nitride layer, a relatively thick (2,000 angstroms, typically) insulating layer of silicon dioxide is deposited. Using suitable conventional masking and etching steps, all three insulating layers are geometrically selectively etched away, in order to expose the portions of the major surface of the silicon body where the drains (and sources in symmetrical structures) are desired in the finished devices. Then the silicon is etched away at these exposed portions, for example, using a plasma etch, thereby creating recess regions each about 0.5 micron deep. Then, donor impurities, such as phosphorous, are implanted in symmetrically limited regions of each recess. The recesses are then oxidized, to fill them with thick silicon dioxide. Next, the originally deposited thick oxide and nitride layers can be removed, leaving thick oxide in the recesses. Heat treatments can optionally be used to push the donor impurities further out under the gate region and up closer to the silicon surface. A bulged buried drain (and bulged buried source, in symmetrical structures) geometry thus results in which the buried drain (and source) bulge from underneath the thick oxide to regions in the silicon body underneath the remaining thin oxide (but not contiguous with the thin oxide). Contacts to the drains (and sources) can then be made by conventional steps of cutting apertures through the thick oxide down to the drains (and sources); and the gate electrode can be deposited by ordinary means, to complete the transistor device.

With some added steps and modifications of the donor impurity implant, various other devices and arrays of devices, such as memory arrays, can be fabricated in a single silicon body.

BRIEF DESCRIPTION OF THE DRAWING

This invention together with its objects, features, and advantages may be better understood from the following detailed description when read in conjunction with the drawings in which.

Only for the sake of clarity, none of the drawings is to scale.

DETAILED DESCRIPTION

Figure 1:
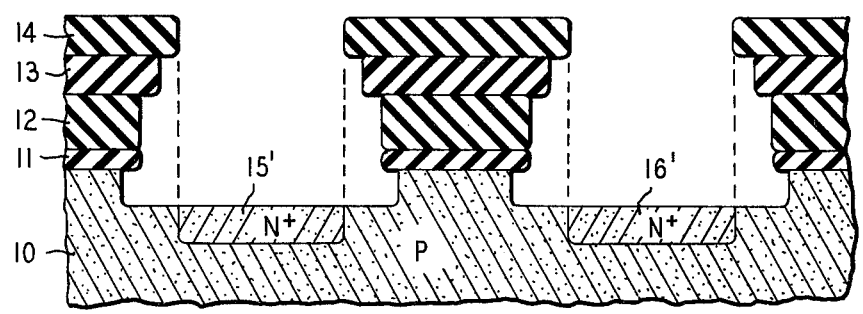
FIGS. 1 through 3 show in cross section various stages in the fabrication of a transistor device, in accordance with a specific embodiment of the invention.

As indicated in FIG. 1, upon a flat (planar) major surface of a P-type silicon body 10 is grown a thin insulating layer of silicon dioxide 11 about 200 angstroms in thickness, typically by thermal oxidation. Then an insulating layer of silicon nitride 12 is deposited on the thin silicon dioxide layer, and a thick insulating layer of silicon dioxide 13 is deposited on the nitride layer. Next, using a photoresist masking layer 14 to define the apertures to be etched, conventional etching techniques are used to etch the apertures through, respectively, the thick silicon dioxide layer, the nitride layer, and the thin silicon dioxide layer. In this way, there remains the nonetched layers 11, 12, and 13 of thin silicon dioxide, silicon nitride, and thick silicon dioxide, respectively. Using these layers as a mask, the exposed portions of the surface of the silicon body 10 are etched to form recesses, typically approximately 0.5μ in depth. This etching of recesses into the silicon can be carried out by means of exposure to a plasma etch, for example, as known in the art. Then phosphorus impurity nuclei are introduced into limited regions 15 and 16 of different recesses by means of ion implantation, typically by a phosphorus ion beam perpendicular to the silicon surface. In this way, the N+ regions 15' and 16' are created, containing an excess phosphorus donor concentration of typically about $5 \times 10^{13}$ atoms per square centimeter to a depth of $10^{-5}$ centimeter in the silicon. At this point in the fabrication process, the stage is reached as shown in FIG. 1.

Figure 2:
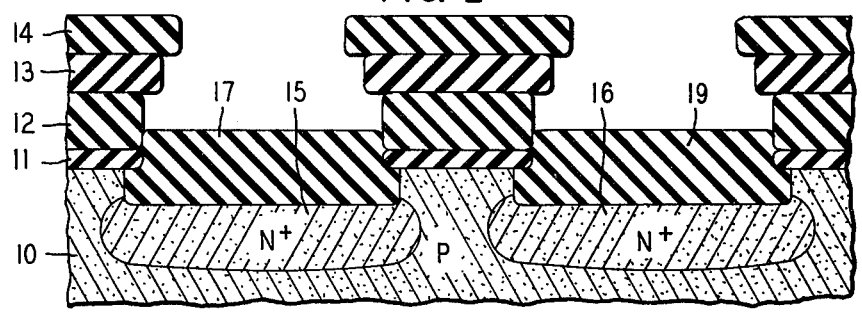

As indicated in FIG. 2, the exposed surfaces of the recesses are thereafter oxidized, either by a known steam or dry thermal oxidation process, thereby forming local oxide regions 17 and 19. The choice of oxidation process depends upon the ultimate phosphorus distribution desired, since all thermal treatments subsequent to the phosphorus implant affect the contours (P-N junctions) of the now buried N+ regions 15 and 16, as should be obvious to the worker in the art. In all these treatments, therefore, it is important that the contours of the buried N+ regions 15 and 16 do not reach the interface of the oxide layer 11 (to serve as gate oxide) particularly when such an N+ region is to serve as a drain of a transistor. Thus, such subsequent heat treatments can be used for the purpose of tailoring the N+ regions and hence the operating characteristics of the final device, particularly the threshold voltage. In any event, the formation by local oxidation of regions 17 and 19 is accompanied by a simultaneous driving of the phosphorus-rich buried N+ regions 15 and 16 in front of the oxide boundary.

Figure 3:
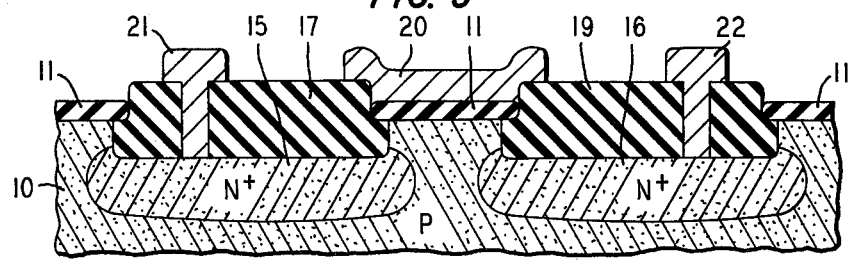

As indicated in FIG. 3, the originally deposited thick oxide layer and the nitride layer are thereafter removed, and further heat treatments can be used to push the phosphorus-rich N+ regions 15 and 16 further out under the gate region (located at the original oxide-silicon interface) and closer to the original oxide-silicon interface. A protruding geometry for the buried N+ regions 15 and 16 can thus be achieved as shown in FIG. 3, that is, these N+ regions extend in the bulk of the semiconductor further out under the gate region than the local oxide regions 17 and 19. Apertures can then be opened in these oxide regions for source and drain contacts 21 and 22, respectively, and a gate electrode 20 (FIG. 3) can then be deposited also, as known in the art. Thus, a completed transistor device is obtained.

Figure 4:
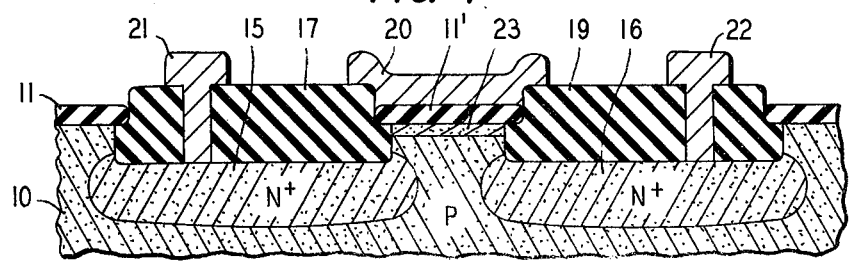
FIG. 4 shows a cross section of a transistor memory device, in accordance with an alternate specific embodiment of the invention.

FIG. 4 illustrates an alternative embodiment of the invention, which is made in the same way as previously described for the device shown in FIG. 3 except for the added step of a self-aligned implant of a thin N-type "skin" or channel region 23 running along the original oxide-semiconductor interface between local oxide regions 15 and 16. This N-type region 23 is advantageously formed by implantation of ions of a significant impurity dopant after growth of the local oxide regions 15 and 16 and after removal of the original thin oxide layer 11 therebetween by a quick etch sufficient to remove thin oxide (but not thick oxide). The implant of this impurity, such as phosphorus, locally changes the conductivity to N type, as known in the art. After such an implant of the N "skin" region 23, the gate oxide 11' is regrown by thermal oxidation, typically at 1050° C., which also anneals the device. Alternatively, the N "skin" region 23 is implanted just subsequent to the growth of the gate oxide, in order to minimize diffusion of this N region. In any event, this N region 23 can be used for memory device applications in which depletion of electrons from the "skin" region by suitable applied voltages can serve as a logical "0" state as opposed to a normal (undepleted) "1" state, by reason of a permanent modification of the threshold voltage caused by such electron depletion.

In the devices illustrated in FIG. 3 or 4, the electric field lines in the vicinity of the drain region 16 are curved away from the interface of the gate oxide 11 or 11'. Accordingly, electrons moving along the channel from the buried source region 15 to the buried drain region 16 (and gaining momentum thereby) do not tend to be injected into the gate oxide but are collected by the drain in accordance with the desired mode of operation. Moreover, the bulging of the source and drain regions toward each other tends to shield the channel from the undesired injection of electrons originating in the bulk of the semiconductor caused by the "substrate" potential of the semiconductor body, which causes undesirable leakage currents during source to "substrate" reverse bias operation.

The fact that the source region 15 is removed from the channel at the oxide-semiconductor surface means that, in addition to the above advantages, there is a potential barrier during operation along the source to channel path. The height and width of this barrier can be tailored either by surface doping (for example, by implantation of variously doped intervening layers) or by location of the source, or both, thus providing added flexibility of control over operating device characteristics. Similarly, there is a potential barrier at the drain which can be similarly tailored for the purpose of reducing threshold (background) currents for low voltage operation. Finally, parasitic capacitances are reduced by reason of the burial of source and drain regions as compared with conventional planar device structures.

Figure 5:
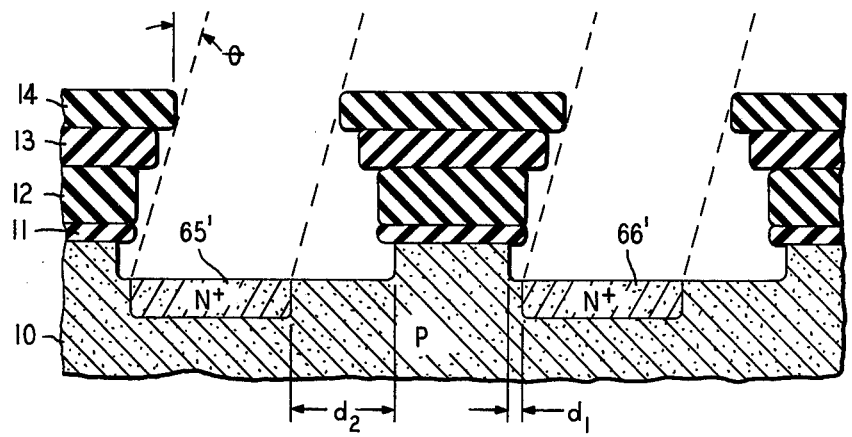
FIGS. 5 and 6 show successive stages in the fabrication of a "source-controlled" MOS capacitor memory device, in accordance with another alternate specific embodiment of the invention.
Figure 6:
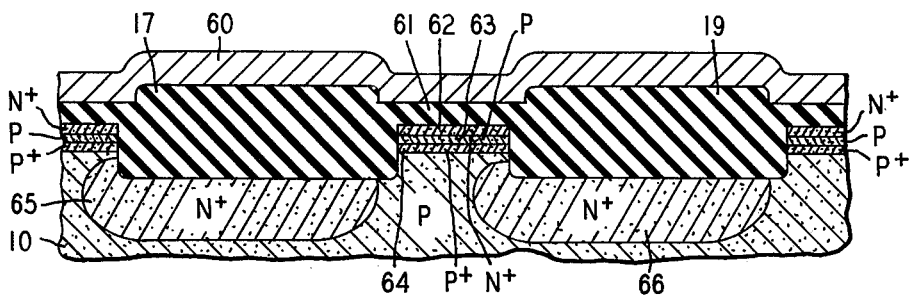

FIGS. 5 and 6 illustrate intermediate and final stages, respectively, of the fabrication of "source-controlled" MOS capacitor devices. These devices take deliberate advantage of the control over source-to-channel barrier mentioned above. The devices are fabricated in the same way as described previously in connection with FIGS. 1 through 3, except for the implantation of phosphorus ions at an angle $\theta$ to the normal to the major surface, in order to produce an asymmetry in the location of the buried N+ regions 65 and 66 with respect to location in the recesses. Accordingly, the distances $d_1$ and $d_2$ of nearest approach of buried N+ region 65 and 66 to the intervening remaining flat surface portion of the semiconductor body are different. A given memory cell is defined essentially by the crosspoint overlap of a gate electrode stripe 60 with a buried N+ region, such as region 66. Thereby, only the N+ region of nearest approach to the flat surface is active in the operation of any given cell. The cell operates therefore not as MOSFET but as a "source-controlled" capacitor. After the local oxidation, these N+ regions bulge out under the gate oxide layer 61 only at the left-hand edges of these N+ regions but not at the right-hand edges. Moreover, an implanted N+ "skin" region 62 and a deeper implanted P+ barrier region 64 are formed at and near the surface, respectively, with an intervening P type region 63 as described below; and the gate electrode 60 is continuous and elongated as an electrode stripe, that is, encompasses many cells. These implants may be performed after gate oxide growth to ensure limited spread of these regions by thermal diffusion in subsequent processing. The implanted $N^{30}$ region 62 is in present technology typically about 3 microns by 10 microns in area, due to limitations in present charge-sensor technology. Each cell has an operating region defined by the left-hand edge of a buried N+ region (such as region 66) and the proximate portion of the gate oxide together with the intervening portion N+ and P+ implanted regions 62 and 64, respectively.

The N+ and P+ regions 62 and 64 are formed by conventional ion implantation preferably after the growth of the gate oxide. The P-type region of substrate chip intervening between the N+ source region 65 and P+ implanted region 64 can be negligibly thick and will be of the same doping as that of the bulk of the substrate chip, which in turn can be the same as that of the intervening P-region 63.

For an illustrative cell design with an overlying gate oxide layer 61 thickness of 1,000 angstroms, the following approximate values of design parameters are expected to be suitable:

N+ implanted region 62:
 thickness = 300 angstroms,
 doping = $3 \times 10^{12}$ atoms per square centimeter (arsenic);
intervening P region 63:
 thickness = 0.07 micron,
 doping = $4 \times 10^{15}$ atoms per cubic centimeter;
P+ implanted region 64:
 thickness = 0.22 micron,
 doping = $3.3 \times 10^{12}$ per square centimeter (boron);
N+ source region 65:
 doping = $10^{18}$ atoms per cubic centimeter.

For another illustrative cell design, the overlying gate oxide layer 61 can be about 500 angstroms thick in combination with the following approximate values of design parameters:

N+ implanted region 62: same;
intervening P region 63:
 thickness = 0.7 micron,
 doping = same;
p+ implanted region 64:
 thickness = 0.23 micron,
 doping = $2.8 \times 10^{12}$ atoms per square centimeter;
N+ source region 65: same.

Figure 7:
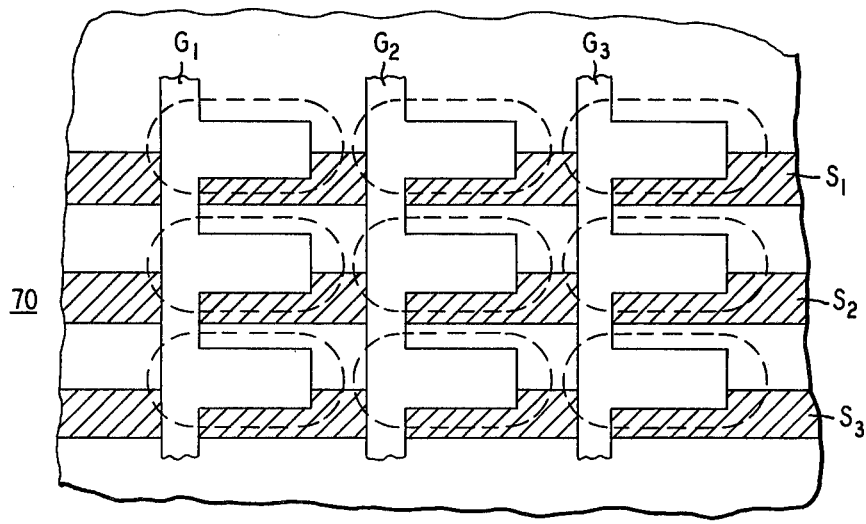
FIG. 7 shows a top view of an integrated circuit array of "source-controlled" MOS capacitor memory devices each fabricated in accordance with the steps shown in FIGS. 5 and 6.

The devices shown in FIG. 6 can be integrated in a rectangular cross-point memory array 70, as shown in FIG. 7. Gate electrode stripes $G_1, G_2, G_3, \ldots$, run vertically in columns, while N+ buried source region stripes $S_1, S_2, S_3, \ldots$, run horizontally in rows. Each of the crosspoint areas enclosed by the dotted line ovals represents a separate two-terminal memory cell defined by the overlap of a gate electrode stripe with a buried source region stripe plus neighboring implanted surface regions. The accumulation vs. no accumulation of charge in the implanted surface region of a cell represents the different memory states of that cell.

The operation of a given cell will now be described. If the buried source stripe and gate electrode of the cell are both grounded (at the same voltage as that of the semiconductor substrate chip), then there is a potential barrier in the P+ implanted region which presents an obstacle against the transfer of electrons between the buried source region and the N+ implanted region of that cell. On the other hand, if a positive voltage is applied to the source region, which is more than sufficient to produce "punch-through," then this barrier is overcome and electrons stored in the N+ implanted region can flow into the source. This "punch-through" voltage will be denoted by $V_p$. Accordingly, the application to the source region of a positive voltage $V_R > V_p$ (while the gate electrode is grounded) is suitable for reading out the presence vs. absence of electrons stored in the N+ implanted region. Conversely, if a positive voltage is applied to the gate electrode (while the source region is grounded), which is more than sufficient to produce "punch-through" in the opposite sense from that produced by $V_R$, then elctrons will flow from the source region to the $N^{30}$ implanted region until the latter region contains sufficient electrons to establish equilibrium. When this equilibrium occurs for a given voltage $V_W$ thus applied to the gate electrode, the given memory cell is said to be in its "1" state; whereas, in the absence of such electrons in the N+ implanted region, the cell is in its "0" state.

For an overlying gate oxide layer 61 of 1,000 angstroms in thickness, the following approximate values are expected to be operative: $V_P = 3.5$ volts, $V_R = 15$ volts, $V_W = 11$ volts; for an overlying gate oxide of 500 angstroms $V_P = 2.5$ volts, $V_R = 9$ volts, $V_W = 5.5$ volts.

Operation of the cells in the array 70 can be performed as follows. In order to perform the readout of all cells in a selected row line (along a selected source stripe), the source stripe of the given row is subjected to an applied voltage of $V_R$ while simultaneously all other source stripes are maintained at "ground" potential (same potential as grounded semiconductor substrate chip). Flip-flop or other charge detectors, each connected to a different column line (gate electrode stripe), will then detect the flow vs. no flow of electron charge in the cells along the selected row in accordance with the "1" vs "0" memory states of each cell at the crosspoint of the corresponding column and selected row. This readout is destructive and thus a re-write operation is required if it is desired to restore the original "1" memory state, if any. This re-write can be performed by applying suitable voltages for selected write-in operation in each cell on the selected row.

In order to write in a given cell located at the crosspoint of a selected row and selected column, the selected row source stripe is maintained at ground potential while all other rows are subjected to $V_W$, and simultaneously the selected column gate electrode stripe is subjected to $V_W$ while all other column gate electrode stripes are grounded or, alternatively, subjected to a voltage of $V_W - V_P$ (in order to inhibit inadvertent erase of the non-selected column cells). In this manner, only the selected crosspoint cell is written in by an electron charge transfer from its buried source region to N+ implanted region.

Although the invention has been described in detail in terms of specific embodiments, various modifications can be made without departing from the scope of the invention. For example, the semiconductor body can be N-type and the implanted regions in the recesses can be P+ type. Moreover, the devices of the types illustrated in FIGS. 3 and 4 can, with obvious modifications, be incorporated into crosspoint arrays similar to the type of array 70 shown in FIG. 7. Also, other impurities of opposite conductivity type from that of the P-type bulk of the semiconductor body can be used instead of phosphorus.

What is claimed is:
1. A method for making a semiconductor memory device which comprises the steps of:
 a. forming at least first and second recess regions in an initially flat portion of a major surface of a semiconductor body of one conductivity type, leaving a first flat surface portion of the body separating said recess regions;
 b. introducing a first impurity of the opposite conductivity determining type into a different limited region of each of said first and second recess regions, each said limited region being noncontiguous with said first flat surface portion, said first recess region having a smaller distance of nearest approach to said flat surface portion than said second recess region, said first and second recess regions being contiguous with the exposed surface of each said recess region, in order to form a different impurity zone in each recess region, the remaining semiconductor body and each said zone forming a different PN junction which is noncontiguous with the said first flat surface portion;

c. thermally growing an oxide of the semiconductor over the exposed surface of said recesses, each of said PN junctions remaining noncontiguous with said first flat surface portion;

d. introducing significant impurities of said one conductivity determining type to a first predetermined depth in the body beneath said first flat surface portion, extending in said body from the first to the second recess regions;

e. introducing significant impurities of opposite conductivity determining type in a region in the body including said first flat surface portion to form a channel region of said opposite conductivity type extending in the body beneath said first flat surface portion to a second, smaller predetermined depth, said channel region connecting said first and second recess regions along the said first flat surface portion; and f. forming an electrode overlying proximate to, but insulated from, the first flat surface portion from said first to said second recess region.

2. The method of claim 1 in which said first distance is such that in response to a suitable voltage, applied across said electrode and said first impurity zone, electrical charge is stored in said channel region.

3. A method for making semiconductor memory device which comprises the steps of:

a. forming by plasma etching at least first and second recess regions in an initially flat portion of a major surface of a semiconductor body of one conductivity type, leaving a first flat surface portion of the body separating said recess regions;

b. introducing a first impurity of the opposite conductivity determining type into a different limited region of each of said first and second recess regions, each said limited region being noncontiguous with said first flat surface portion, said first recess region having a smaller distance of nearest approach to said flat surface portion than said second recess region, said first and second recess regions being contiguous with the exposed surface of each said recess region, in order to form a different impurity zone in each recess region, the remaining semiconductor body and each said zone forming a different PN junction which is noncontiguous with the said first flat surface portion;

c. thermally growing an oxide of the semiconductor over the exposed surface of said recesses, each of said PN junctions remaining noncontiguous with said first flat surface portion;

d. introducing by ion implantation significant impurities of said one conductivity determining type to a first predetermined depth in the body beneath said first flat surface portion, extending in said body from the first to the second recess regions;

e. introducing by ion implantation significant impurities of opposite conductivity determining type in a region in the body including said first flat surface portion to form a channel region of said opposite conductivity type extending in the body beneath said first flat surface portion to a second, smaller predetermined depth, said channel region connecting said first and second recess regions along the said first flat surface portion; and f. forming an electrode overlying proximate to, but insulated from, the first flat surface portion from said first to said second recess region.

* * * * *